(12) United States Patent
Hara (10) Patent No.: US 6,897,939 B2
(45) Date of Patent: May 24, 2005

(54) EXPOSURE APPARATUS

(75) Inventor: Hiromichi Hara, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/704,688

(22) Filed: Nov. 12, 2003

(65) Prior Publication Data

US 2004/0137384 A1 Jul. 15, 2004

(30) Foreign Application Priority Data

Jan. 14, 2003 (JP) ........................................ 2003-005890

(51) Int. Cl.[7] ........................ G03B 27/42; G03B 27/58; G03B 27/62
(52) U.S. Cl. ............................. 355/53; 355/72; 355/75
(58) Field of Search ............................ 355/53, 72–76; 277/391

(56) References Cited

U.S. PATENT DOCUMENTS

| | | | |
|---|---|---|---|
| 5,881,987 A | 3/1999 | Hara | 248/550 |
| 6,014,421 A | 1/2000 | Chiba et al. | 378/34 |
| 6,323,494 B1 * | 11/2001 | Lee | 250/442.11 |
| 6,493,062 B2 | 12/2002 | Tokuda et al. | 355/53 |
| 6,496,248 B2 * | 12/2002 | Tanaka | 355/72 |
| 2002/0159042 A1 * | 10/2002 | Poon | 355/53 |
| 2003/0137643 A1 * | 7/2003 | Jacobs et al. | 355/53 |

FOREIGN PATENT DOCUMENTS

| | | | |
|---|---|---|---|
| JP | 6066346 | * | 8/1994 |
| JP | 9-298142 | | 11/1997 |

* cited by examiner

Primary Examiner—Henry Hung Nguyen
(74) Attorney, Agent, or Firm—Fitzpatrick, Cella, Harper & Scinto (57) ABSTRACT

An exposure apparatus for exposing a substrate in a vacuum atmosphere includes vibration absorbing mounts that are disposed in a vacuum chamber in order to make it possible to support at least one exposure structure in the vacuum atmosphere with high precision. The at least one exposure structure includes at least one of a mask stage plate, a wafer stage plate, and a barrel surface plate. The vibration absorbing mounts are formed using metallic bellows. By the vibration absorbing mounts, the at least one exposure structure is supported in the vacuum chamber.

7 Claims, 10 Drawing Sheets

EXPOSURE APPARATUS

BACKGROUND OF THE INVENTION

1. Field of the Invention

The present invention relates to an exposure apparatus for forming a pattern on a semiconductor wafer, used as a substrate, by exposure in a vacuum atmosphere.

2. Description of the Related Art

In producing devices with fine patterns, such as semiconductor devices (semiconductor integrated circuits, for example), micromachines, and thin-film magnetic heads, using a mask (original plate), a desired pattern is formed on a semiconductor wafer (used as a substrate that is a transfer member) by illuminating the wafer with exposure light (exposure energy) either directly or through a projection lens (projection system). Hereafter, the term "exposure light" will be used as a general term to include visible light, ultraviolet light, extreme ultraviolet (EUV) light, X-rays, electron rays, and charged particles; and the term "projection lens" will be used as a general term to include a refractive lens, a reflective lens, a catadioptric lens, and a charged particle lens.

In producing a semiconductor device, when a mask, which is formed in correspondence with a desired circuit pattern, is provided for a semiconductor wafer with a resist coated on its surface, the circuit pattern is transferred onto the semiconductor wafer by illuminating the semiconductor wafer with exposure light through the mask and the resist is selectively exposed. After this, etching and film deposition are carried out. By repeating these steps, a desired circuit is formed on the semiconductor wafer. Even in the case in which a circuit pattern is directly formed on a semiconductor wafer without using a mask, a desired pattern is formed on the semiconductor wafer by the same steps.

An exposure apparatus that uses as exposure light extreme ultraviolet (EUV) light having an oscillation spectrum in a wavelength range of from 5 nm to 15 nm (i.e., the soft X-ray region) is disclosed in, for example, Japanese Patent Application Laid-Open No. 09-298142. (Such an exposure apparatus will hereafter be referred to as an "EUV exposure apparatus.")

In an EUV exposure apparatus, the surrounding environment of an illumination light path from an EUV light generating source to a mask and/or an exposure light path from the mask to a wafer is in a vacuum. Hereafter, although the present invention will be described by taking the EUV exposure apparatus as an example, the present invention may also be applied to exposure apparatuses which, as in the EUV exposure apparatus, require the surrounding environment of its exposure light path to be in a vacuum and which make use of a charged-particle beam exposure such as an ion-beam exposure or an electron-beam exposure.

In the EUV exposure apparatus, a mask stage for holding a mask (or reticle), used as an original plate, and a wafer stage for holding a wafer, used as a substrate, need to be in synchronism with high precision in order to perform scanning and exposure operations. At the same time, in the EUV exposure apparatus, at least one exposure structure needs to be supported with high precision while removing and/or deadening vibration of the at least one exposure structure. The at least one exposure structure includes at least one of a projection lens (used as a projection system), a mask stage plate for supporting the mask stage, and a wafer stage plate for supporting the wafer stage.

In general, in order to remove and/or to deaden vibration, the at least one exposure structure is supported with respect to the floor (serving as a base) or a vacuum chamber (used to form a vacuum atmosphere) through, for example, a vibration absorber. The vibration absorber absorbs the vibration of the at least one exposure structure by absorbing the vibration from the floor. If necessary, the vibration absorber is provided with another function of deadening vibration to restrict vibration that is generated by the movement of the stages on the respective stage plates.

A damper or an actuator of the vibration absorber is often formed by using an air spring as a gas spring, so that there is a problem in supporting the at least one exposure structure, such as a projection lens, in a vacuum atmosphere.

One method of solving the problem referenced above is to dispose the vibration absorber at the outer side of the vacuum chamber and to support this and the at least one exposure structure in the vacuum chamber with, for example, a support by joining them with the support. However, when this method is used, an opening for passing the support through the vacuum chamber is required, thereby giving rise to a problem in that the opening must be covered in order to cut off the inside of the chamber from the outside atmosphere. In addition, this method has still another problem of the generation of a large amount of vibration due to the rigidity of the support.

SUMMARY OF THE INVENTION

It is an object of the present invention to provide an exposure apparatus for exposing a substrate in a vacuum atmosphere, which makes it possible to support an exposure structure with high precision in the vacuum atmosphere.

To this end, according to a first aspect, the present invention provides an exposure apparatus for exposing a substrate in a vacuum atmosphere. The exposure apparatus comprises a vibration absorber, disposed in a vacuum chamber, comprising metallic bellows, wherein an exposure structure in the vacuum chamber is supported by the vibration absorber.

According to the present invention, in the exposure apparatus, an opening for passing a support for connecting the exposure structure and the vibration absorber is not required, so that the problem of a large amount of vibration occurring due to the rigidity of the support does not arise. In addition, compared to the case in which the vibration absorber is disposed outside the vacuum chamber, the vibration absorber can be disposed with respect to the exposure structure with fewer restrictions, so that the space occupied by the exposure apparatus (including the vacuum chamber) can be small, thereby making it possible to optimally remove vibration, and, if necessary, deaden vibration.

According to the present invention, unlike other arrangements, such as in the case in which a rubber, a damper, or a spring is used, the problem of the degree of vacuum of the vacuum environment or atmosphere being reduced or not rising due to the passage of outgas from the rubber and air (gas) in the spring does not arise.

The metallic bellows are highly rigid in a direction at right angles to a driving direction (or in a direction perpendicular to the driving direction), so that, if a connecting mechanism that has low rigidity in the direction perpendicular to the driving direction is provided in series using a metallic rod or the like, an actuator that is flexible in the driving direction and in the direction perpendicular to the driving direction can be provided.

It is also possible to utilize, for example, sensors, such as an accelerometer, a displacement gage, or an electromagnetic actuator, or actuators, which are not produced for use in a vacuum.

Further objects, features and advantages of the present invention will become apparent from the following description of the preferred embodiments with reference to the attached drawings.

DESCRIPTION OF THE PREFERRED EMBODIMENTS

Figure 1:
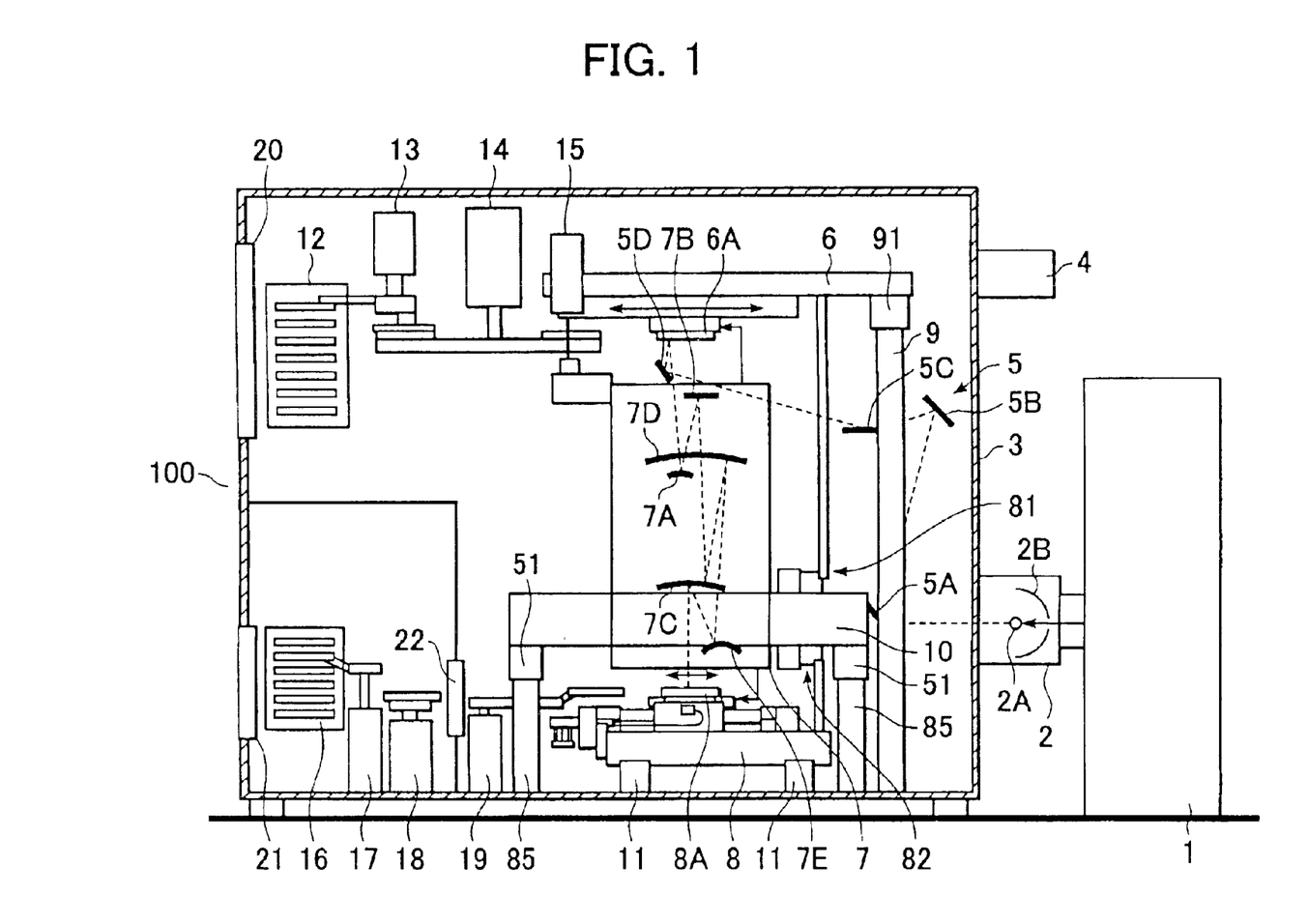
FIG. 1 shows an exposure apparatus of a first embodiment of the present invention.

Hereafter, preferred embodiments of the present invention will be discussed with reference to the appended drawings.
First Embodiment FIG. 1 is a schematic view of the structure of an exposure apparatus 100 of a first embodiment of the present invention. In FIG. 1, reference numeral 1 denotes a pump laser for causing a light source material, which is a light-emitting point of a light source, to emit extreme ultraviolet (EUV) light by irradiating with a laser a material point that has been gasified, liquefied, or turned into atomized gas and by subjecting the atoms of the light source material to plasma enhancement. In this embodiment, a solid-state YAG laser or the like is used as the pump laser 1.

Reference numeral 2 denotes a light-emitting section of a light source, whose inside is kept in a vacuum. Here, symbol 2A denotes the light source, which is the actual light-emitting point. A light source mirror 2B is provided around the light source 2A and converges light from the entire spherical surface of the light source 2A in a light-emitting direction and reflects the converged light in order to generate exposure light. In this embodiment, the light source mirror 2B is a hemispherical mirror with the position of the light source 2A as the center. Liquefied xenon, atomized liquefied xenon, or xenon gas is provided at the light source 2A as a light-emitting element from a nozzle (not shown).

Reference numeral 3 denotes a vacuum chamber used as an environmental chamber and accommodates the whole exposure apparatus 100. Reference numeral 4 denotes a vacuum pump, which maintains the vacuum state in the vacuum chamber 3 by discharging gas. Reference numeral 5 denotes an exposure-light introducing section for introducing and shaping the exposure light from the light-emitting section 2. The exposure-light introducing section 5 comprises mirrors 5A to 5D and makes uniform and shapes the exposure light.

Reference numeral 6 denotes a mask stage. A reflective mask (or a reticle) 6A is placed on a movable section of the mask stage 6. The reflective mask 6A is a reflective original plate of an exposure pattern. Reference numeral 7 denotes a reduction projection mirror optical system used as a projection lens that is a projection system. The reduction projection mirror optical system 7 projects in reduced form the exposure pattern that has been formed by exposure light reflected by the mask 6A onto a wafer 8A, which is held on a wafer stage 8. In the reduction projection mirror optical system 7, the exposure light is projected and reflected by mirrors 7A, 7B, and 7C, at the mask 6A side, and by mirrors 7D and 7E and the mirror 7C, at the wafer 8A side, in that order. Finally, an image of the exposure pattern is projected in a reduced form onto the wafer 8A with a specified demagnification ratio.

The mirrors 5A to 5D of the exposure-light introducing section 5 and the mirrors 7A to 7E of the reduction projection mirror optical system 7 each have a reflective surface, formed by depositing or sputtering a multilayer Mo—Si film, for reflecting the exposure light from the light source 2A.

As mentioned above, reference numeral 8 denotes the wafer stage for holding the wafer 8A (substrate). A silicon (Si) substrate is used for the wafer 8A. The Si substrate is exposed to an image of the exposure pattern image on the mask 6A by reflection and projection of the image in a reduced form. In order to position the wafer 8A at a predetermined exposure position, the positioning of the wafer stage 8 is controlled so as to be drivable in six directions, that is, in the x-axis, y-axis, and z-axis directions; tilting directions ($\omega x$, $\omega y$) around the x axis and the y axis; and the rotational direction ($\theta$) around the z axis.

Reference numeral 9 denotes a mask stage support in the vacuum chamber 3. The mask stage support 9 supports a mask stage plate for the mask stage 6 through a vibration absorbing mount 91 (vibration-absorbing mechanism) in the vacuum chamber 3. Although the mask stage support 9 is secured to the floor of the vacuum chamber 3, it may be secured to the floor where the entire exposure apparatus 100, including the vacuum chamber 3, is set.

The vibration absorbing mount 91 includes an actuator or a damper making use of air as gas as described below, and vibrationally isolates the mask stage plate 8A and the mask stage support 9.

Reference numerals 85 denote a plurality of barrel surface plate supports in the vacuum chamber 3. As shown in detail in FIG. 2, the barrel surface plate supports 85 support a barrel surface plate 10, which holds a lens barrel of the reduction projection mirror optical system 7, through vibration absorbing mounts 51 (vibration absorbers) in the vacuum chamber 3. Although the barrel surface supports 85 are secured to the floor of the vacuum chamber 3, they may be secured to the floor where the entire exposure apparatus 100, including the vacuum chamber 3, is set.

Figure 2:
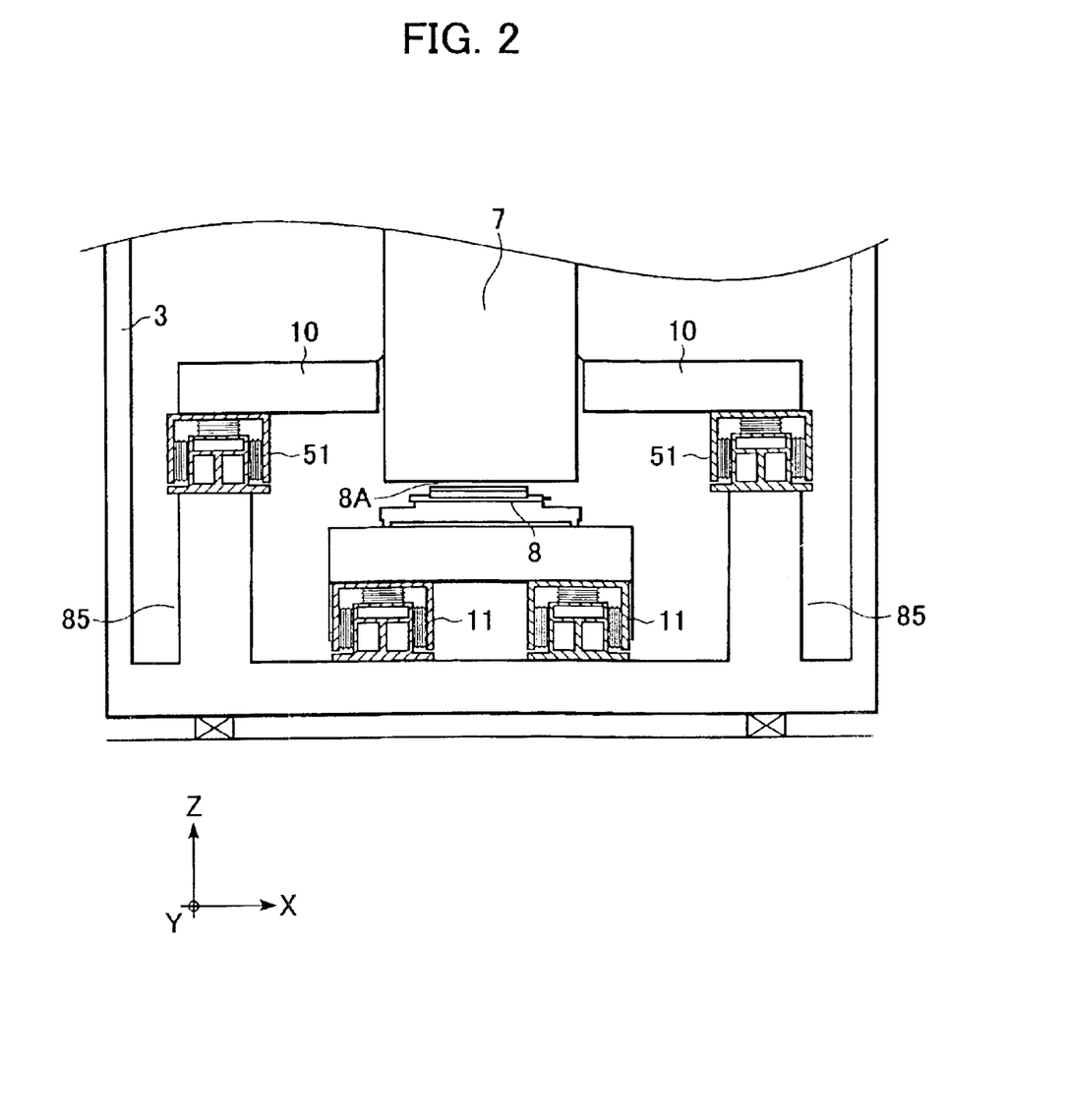
FIG. 2 shows the main portion of the first embodiment of the present invention.

The vibration absorbing mounts 51 each include an actuator or a damper making use of air as gas as described below, and vibrationally isolate the barrel surface plate 10 and the barrel surface plate supports 85.

Reference numerals 11 denote vibration absorbing mounts (vibration absorbers) in the vacuum chamber 3. As shown in detail in FIG. 2, they support a wafer stage plate 8A for the wafer stage 8 with respect to a wafer stage support (not shown) secured to the floor of the vacuum chamber 3.

Although the wafer stage support is secured to the floor of the vacuum chamber 3, it may be secured to the floor where the entire exposure apparatus 100, including the vacuum chamber 3, is set.

The vibration absorbing mounts 11 each include an actuator or a damper making use of air as gas as described below, and vibrationally isolate the wafer stage plate and wafer stage table support.

As shown in FIG. 1, by the respective vibration absorbing mounts 91, 51, and 11, the mask stage 6 (and/or the mask stage plate), the reduction projection mirror optical system 7 (and/or the barrel surface plate 10), and the wafer stage 8 (and/or the wafer stage plate) are positioned in the vacuum chamber 3 in a vibrationally isolated state from either the vacuum chamber 3 or the floor where the vacuum chamber 3 is set. Accordingly, the mask stage 6 (and/or the mask stage plate), the reduction projection mirror optical system 7 (and/or the barrel surface plate 10), and the wafer stage 8 (and/or the wafer stage plate) are separately and independently supported by their respective vibration absorbing mounts 91, 51, and 11, and are vibrationally isolated from each other.

The relative positions between the mask stage plate for the mask stage 6 and the barrel surface plate 10, which holds the reduction projection mirror optical system 7, are measured in terms of some of or all of the x, y, z, $\omega x$, $\omega y$, and $\theta$ directions using a laser interferometric length measuring device 81, used as a relative position detector. Then, based on the measured values, they are continuously maintained in a predetermined relative positional relationship by controlling the actuator or damper using an air spring in the vibration absorbing mount 91 or the actuators or the dampers using air springs in the vibration absorbing mounts 51. Similarly, the relative positions between the barrel surface plate 10, which holds the reduction projection mirror optical system 7, and the wafer stage plate for the wafer stage 8, are measured in terms of some of or all of the x, y, z, $\omega x$, $\omega y$, and $\theta$ directions using a laser interferometric length measuring device 82, used as a relative position detector. Then, based on the measured values, they are continuously maintained in a predetermined relative positional relationship by controlling the actuators or dampers using air springs in the vibration absorbing mount 51 or the vibration absorbing mounts 11.

Although the vibration absorbing mounts 91, 51, and 11 isolate vibration transmitted to the respective mask stage plate for the mask stage 6, reduction projection mirror optical system 7, and wafer stage plate for the wafer stage 8 from the vacuum chamber 3 or the floor where the vacuum chamber 3 is set, the actuators or dampers making use of the air springs may be controlled so that vibration of the mask stage plate that is generated by the movement of the mask stage 6 and vibration of the wafer stage plate that is generated by the movement of the wafer stage 8 are controlled. In projecting an image of the pattern of the mask 6A onto an area of the wafer 8A and exposing the area of the wafer 8A through the reduction projection mirror optical system 7, the exposure apparatus 100 shown in FIG. 1 scans and exposes the wafer 8A while synchronizing the mask stage 6 and the wafer stage 8 in the direction of the arrows shown in FIG. 1. Since, in the exposure apparatus 100 shown in FIG. 1, the wafer 8A is exposed successively by repeating stepwise movement and scanning and exposure of each area of the wafer 8A, the exposure apparatus 100 is generally called a step-and-scan type.

Reference numeral 12 denotes a mask stocker for temporarily storing the mask 6A in the vacuum chamber 3 from outside the vacuum chamber 3. In the mask stocker 12, a plurality of masks having different patterns and different exposure conditions are hermetically stored in a storage container. Reference numeral 13 denotes a mask changer for selectively transporting a mask, to be used, from the mask stocker 12.

Reference numeral 14 denotes a mask alignment unit, which has a hand that can be rotated in the x, y, and z directions or around the z axis ($\theta$). The mask alignment unit 14 receives a mask 6A from the mask changer 13, rotationally transports it by 180 degrees within a field of view of a mask alignment scope 15 at an end portion of the mask stage 6, and moves the mask 6A by a small amount in the directions of rotation ($\theta$) around the x, y, and z axes with respect to an alignment mark that is provided with reference to the reduction projection mirror optical system 7, in order to align the mask 6A with the alignment mark. In other words, by finely adjusting the mask 6A in an x-y shifting direction and the direction of rotation ($\theta$) around the z axis, an alignment mark of the mask 6A is aligned with the alignment mark that is provided with reference to the reduction projection mirror optical system 7. In this way, when the mask 6A is secured to the mask stage, the mask 6A is aligned with the reduction projection mirror optical system 7 serving as a projection reference. The aligned mask 6A is then chucked on the mask stage 6.

Reference numeral 16 is a wafer stocker for temporarily storing the wafer 8A in the vacuum chamber 3 from outside the vacuum chamber 3. In the wafer stocker 16, a plurality of wafers are stored in a storage container. Reference numeral 17 denotes a wafer transporting robot, which selects a wafer to be exposed from the wafers in the wafer stocker 16 and transports the selected wafer to a wafer mechanical pre-alignment heat regulator 18. The wafer mechanical pre-alignment heat regulator 18 roughly adjusts the transportation of the wafer 8A in the direction of rotation ($\theta$) and, at the same time, adjusts the temperature of the wafer 8A to that in the exposure apparatus 100. Reference numeral 19 denotes a wafer transporting hand, which transports the wafer 8A, which has been aligned and whose temperature has been adjusted by the wafer mechanical pre-alignment heat regulator 18, to the wafer stage 8.

Reference numerals 20 and 21 denote gate valves, which are gate opening-and-closing mechanisms for inserting a mask 6A and a wafer 8A to/from outside the vacuum chamber 3. Reference numeral 22 similarly denotes a gate valve, which separates, by a division wall, a space where the wafer stocker 16 and the wafer mechanical pre-alignment heat regulator 18 are disposed and an exposure space in the vacuum chamber 3, and which opens and closes only when the wafer 8A is transported into and out of the vacuum chamber 3. In this way, by separating the spaces by the division wall, when the wafer 8A is transported into and out of the vacuum chamber 3, the area that is open to the atmosphere is minimized, so that the area can quickly return to its vacuum state.

The vibration-removing mechanisms 11, 51 and 91 will be described in more detail with reference to FIG. 3. Since these mechanisms all have the same structure, a vibration-absorbing mechanism 51 will be taken as an example in the description below. The vibration-removing mechanisms 11, 51, and 91 do not, however, all have to be of the same structure, so that structures of other embodiments described below may be used in combination.

Figure 3:
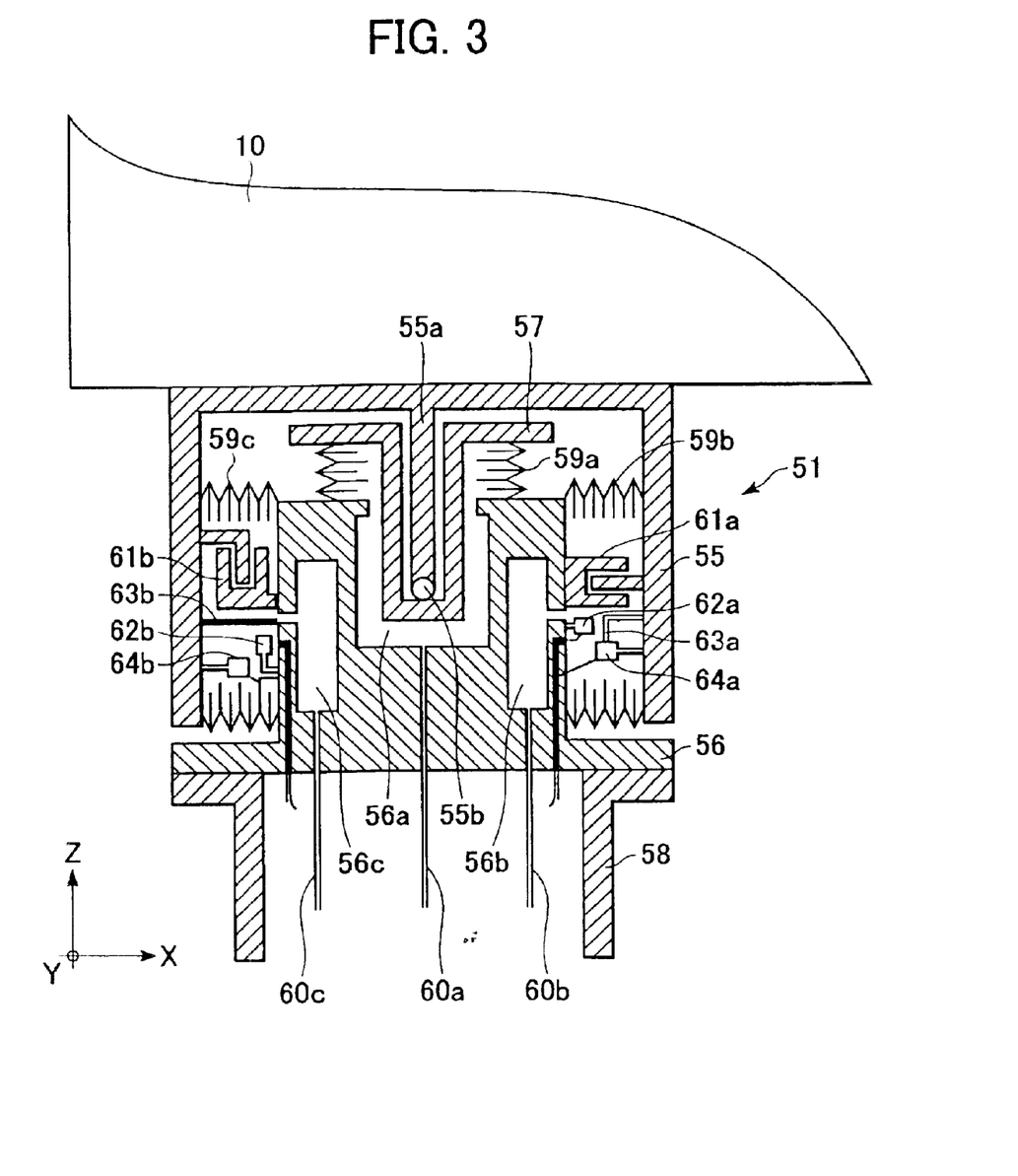
FIG. 3 shows a vibration absorbing mount in the first embodiment of the present invention.

In FIG. 3, the vibration-absorbing mechanism 51 comprises a movable cover 55, serving as a box-shaped movable member, having an open bottom; and a supporting block 56, serving as a support, which is mounted and secured to a barrel surface plate support 58. The movable cover 55 is mounted and secured to the barrel surface plate 10. A rod 55a of a gimbal piston 57, serving as a displacement absorbing mechanism, is disposed at the center or essentially the center of the inner, upper surface of the movable cover 55. An end of the rod 55a is supported at the bottom surface of a cylinder of the gimbal piston 57 through a metallic ball 55b. The gimbal piston 57 is flexible in a direction parallel to an x-y plane due to this structure.

In order to form a hermetically sealed space between the supporting block 56 and the gimbal piston 57, metallic (stainless steel (for example, SUS 304)) bellows 59a, which are folded in the z-axis direction so as to be expandable and contractible in the z-axis direction, are provided. They operate cooperatively with respect to a space 56a that is formed in the supporting block 56, and form air springs, serving as gas springs, which support the barrel surface plate 10 with respect to the barrel surface plate support 58 in the z-axis direction. The metallic bellows 59a have a higher rigidity in a direction parallel to an x-y plane extending perpendicular to or crossing the z-axis than in the z-axis direction. In this condition, relative movement between the movable cover 55 and the supporting block 56 is restricted in the direction parallel to the x-y plane, but the relative movement in the direction parallel to the x-y plane is compensated for by the gimbal piston 57.

In order to form hermetically sealed spaces between both sides of the supporting block 56 in the x-axis direction and the movable cover 55, metallic (stainless steel (for example, SUS 304)) bellows 59b and 59c are provided. These bellows are folded in the x-axis direction so as to be expandable and contractible in the x-axis direction. Further, they operate cooperatively with respect to respective spaces 56b and 56c, which are formed in the supporting block 56, and form air springs, serving as gas springs, which support the barrel surface plate 10 with respect to the barrel surface plate support 58 in the x-axis direction. Just as the metallic bellows 59b and 59c are provided, in order to form hermetically sealed spaces between both sides of the supporting block 56 in the y-axis direction and the movable cover 55, metallic (stainless steel (for example, SUS 304)) bellows are provided. These bellows are folded in the y-axis direction so as to be expandable and contractible in the y-axis direction. These metallic bellows have the same structures as those of the metallic bellows 59b and 59c, so that a description of their structures will not be repeated.

The metallic bellows are formed of stainless steel (for example, SUS 304) because this material prevents rusting (that is, the bellows do not have to be plated) and can be electropolished.

The spaces 56a, 56b, and 56c are joined to a gas supply source (not shown) through respective conduits 60a, 60b, and 60c. In order to remove vibration of the barrel surface plate 10, the pressure in each of the spaces 56a, 56b, and 56c is controlled. If necessary, the pressure in each of the spaces 56a, 56b, and 56c may also controlled in order to restrict vibration.

A linear motor or a voice coil motor (serving as an actuator 61a), a position sensor 62a, and an accelerometer (serving as a vibration sensor 64a) are disposed in the air springs that are formed by the metallic bellows 59b and the space 56b so that they are separated from the surrounding vacuum atmosphere. The actuator 61a exerts a force upon the movable cover 55 (barrel surface plate 10) in the x-axis direction with the supporting block 56 (barrel surface plate support 58) as a reference. The position sensor 62a is mounted and secured to the supporting block 56 in order to detect the displacement of a detection target 63a, mounted and secured to the movable cover 55, in the x-axis direction with the supporting block 56 as a reference. The vibration sensor 64a is mounted and secured to the movable cover 55. The position sensor 62a detects the relative displacement along the x-axis direction between the barrel surface plate 10 and the barrel surface plate support 58. The vibration sensor 64a detects the vibration of the barrel surface plate 10.

A linear motor or a voice coil motor (serving as an actuator 61b), a position sensor 62b, and an accelerometer (serving as a vibration sensor 64b) are disposed in the air springs that are formed by the metallic bellows 59c and the space 56c. The actuator 61b exerts a force upon the movable cover 55 (barrel surface plate 10) in the z-axis direction with the supporting block 56 (barrel surface plate support 58) as a reference. The position sensor 62b is mounted and secured to the supporting block 56 in order to detect the displacement of a detection target 63b, mounted and secured to the movable cover 55, in the z-axis direction with the supporting block 56 as a reference. The vibration sensor 64b is mounted and secured to the movable cover 55. The position sensor 62b detects the relative displacement along the z-axis direction between the barrel surface plate 10 and the barrel surface plate support 58. The vibration sensor 64b detects the vibration of the barrel surface plate 10.

An output of each sensor is sent to and processed by a controller (not shown). In order to restrict vibration and displacement of the barrel surface plate 10, the processed outputs are sent as control signals to the respective actuators 61a and 61b and to the aforementioned gas supply source (not shown). A wiring arrangement for sending the control signals for controlling the respective actuators and the outputs from the sensors is guided to a space in the barrel surface plate support 58 through the inside of the supporting block 56. Similarly, sensors and an actuator are disposed in air springs that are disposed in the y-axis direction. By this, a hybrid active damper that uses air springs and an actuator is formed in order to effectively remove or to restrict vibration.

Figure 9A:
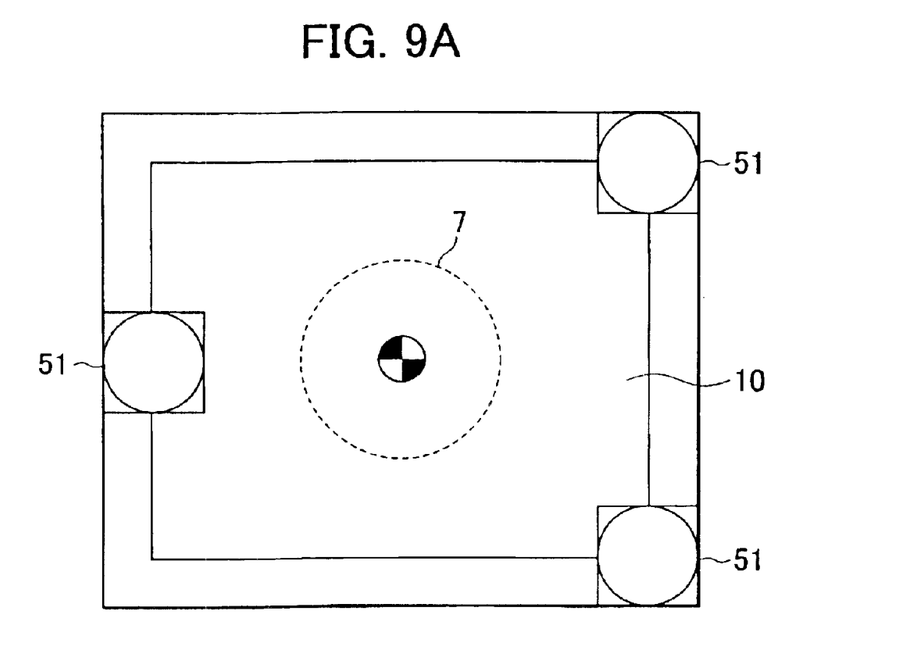
FIGS. 9A and 9B show examples of arrangements of vibration-absorbing mounts.
Figure 9B:
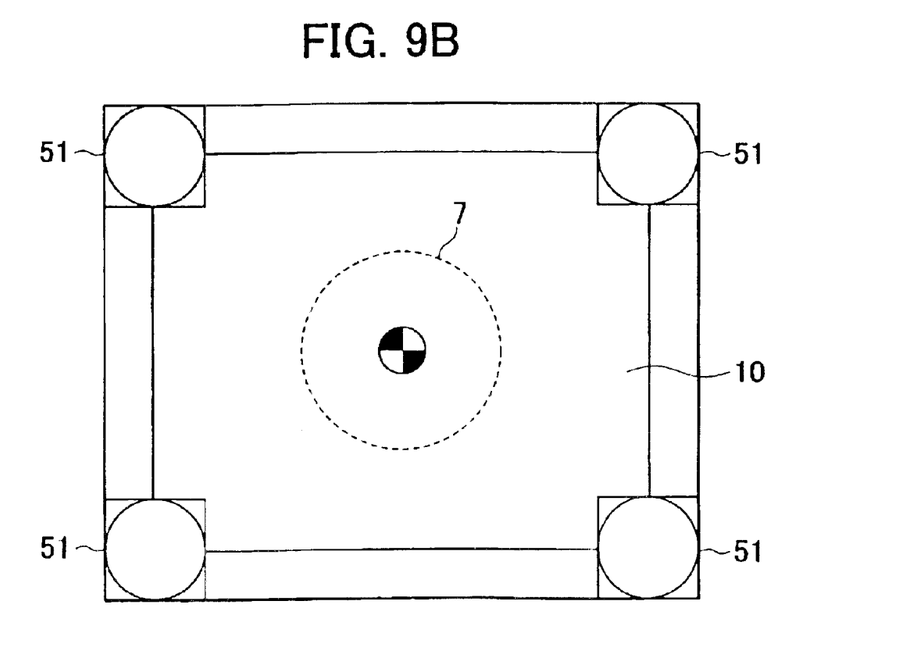

FIGS. 9A and 9B show the barrel surface plate 10 as viewed in the z-axis direction, illustrating the arrangement of the vibration absorbing mounts with respect to the barrel surface plate 10. FIG. 9A shows an example in which three vibration absorbing mounts 51 are disposed with respect to the barrel surface plate 10. FIG. 9B shows an example in which four vibration absorbing mounts 51 are disposed with respect to the barrel surface plate 10.

Second Embodiment

Figure 4:
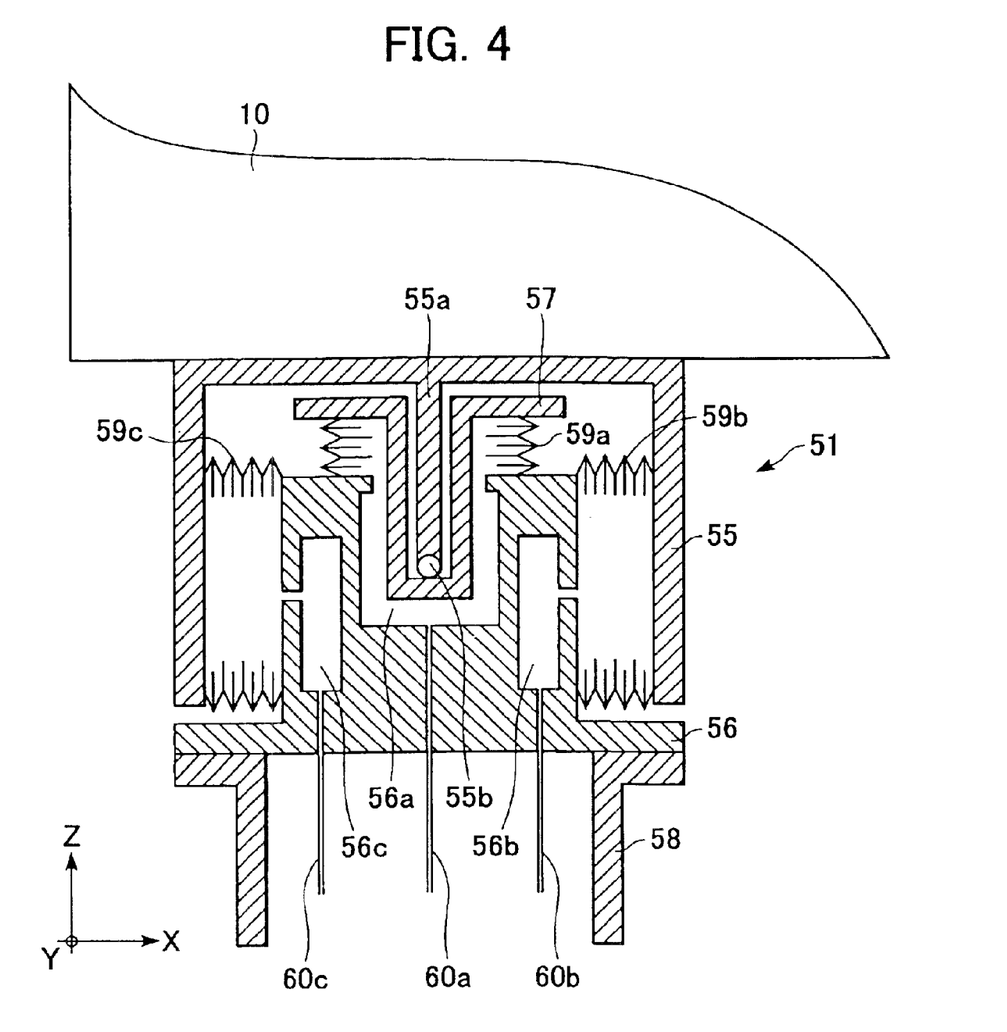
FIG. 4 shows a second embodiment of the present invention.

The second embodiment, shown in FIG. 4, differs from the first embodiment in that the sensors and actuators used in the first embodiment are not provided, and this embodiment features an active or a passive damper structure, which is not considered to be a hybrid. The other structural features are the same as those of the first embodiment.

Third Embodiment

Figure 5A:
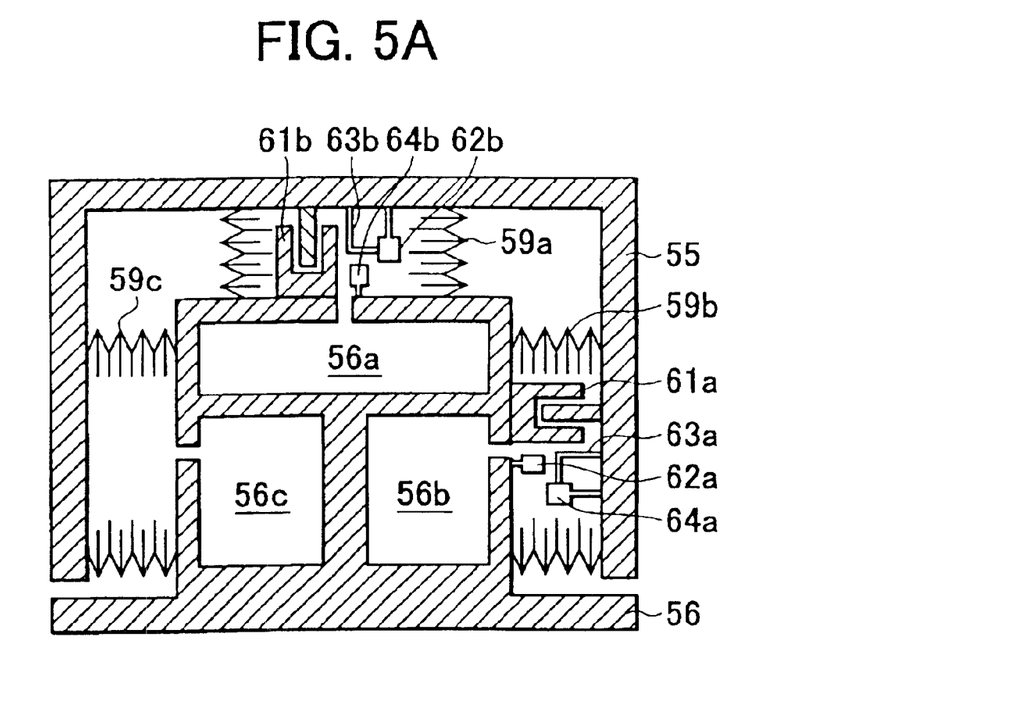
FIG. 5A shows a third embodiment of the present invention.

The third embodiment, shown in FIG. 5A, differs from the first embodiment in that an actuator 61b, a position sensor 62b, a detection target 63b, and a vibration sensor 64b are disposed in a space defined by metallic bellows 59a and a space 56a. This embodiment also differs from the first embodiment in that a gimbal piston 57 is not disposed between a movable cover 55 and a supporting block 56. This embodiment also features a hybrid active damper structure using air springs and actuators in order to remove or to restrict vibration effectively.

Fourth Embodiment

Figure 5B:
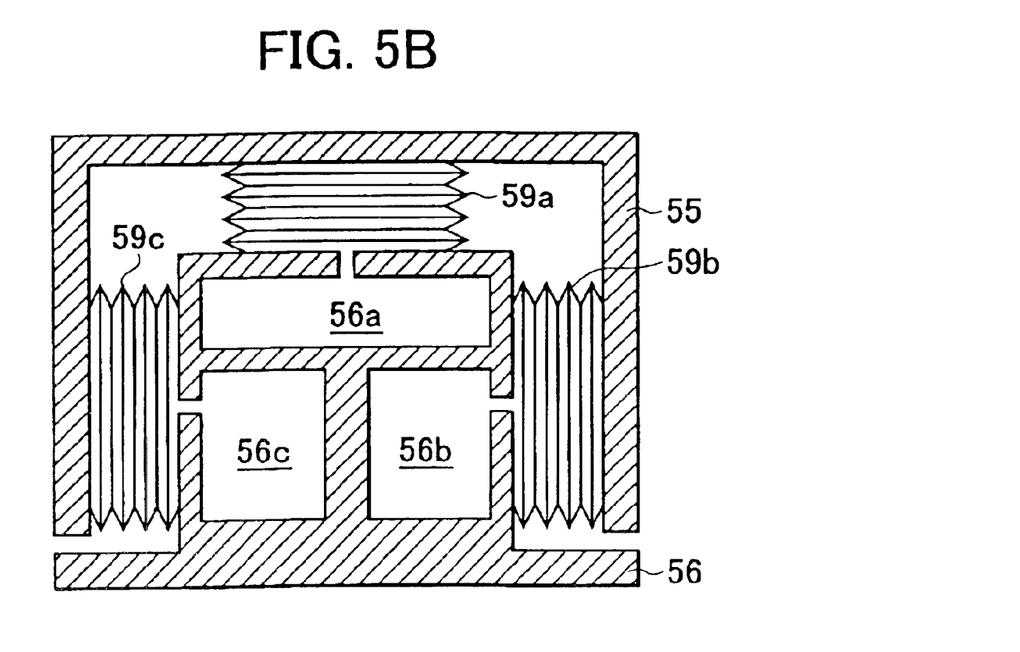
FIG. 5B shows a fourth embodiment of the present invention.

The fourth embodiment, shown in FIG. 5B, differs from the third embodiment in that the sensors and actuators used in the third embodiment are not provided, and in that this embodiment features an active or a passive damper structure, which is not considered to be a hybrid. The other structural features are the same as those of the third embodiment.

Fifth Embodiment

Figure 6A:
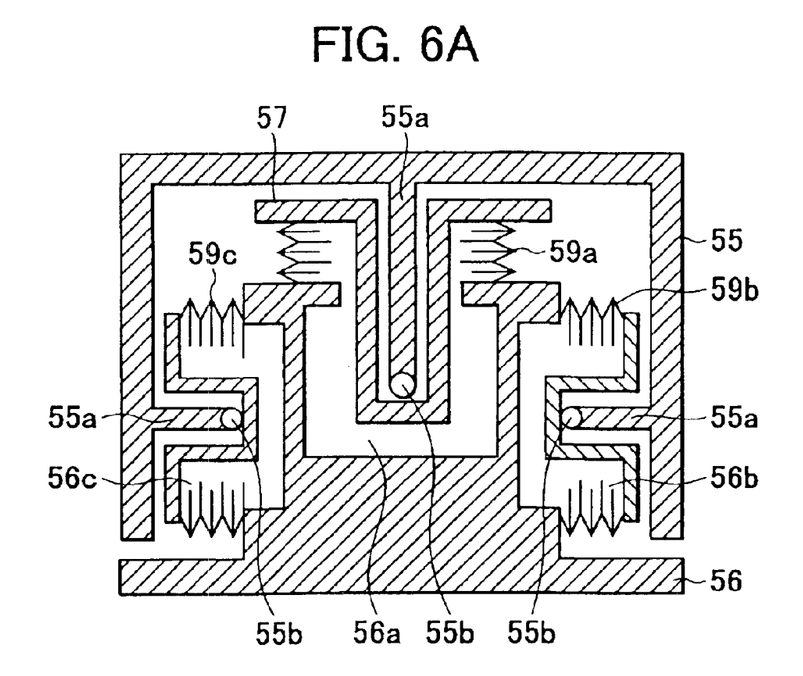
FIG. 6A shows a fifth embodiment of the present invention.

The fifth embodiment, shown in FIG. 6A, differs from the first embodiment in that each air spring is provided with a gimbal piston as shown in the first embodiment, but that sensors and actuators are not provided. This embodiment also differs from the first embodiment in that this embodiment features an active or a passive damper structure, which is not considered to be a hybrid. Further, in this embodiment, metallic bellows 59b and 59c do not restrict the displacement of a movable cover 55 and a supporting block 56 in the z-axis direction. The other structural features are the same as those of the first embodiment.

Sixth Embodiment

Figure 6B:
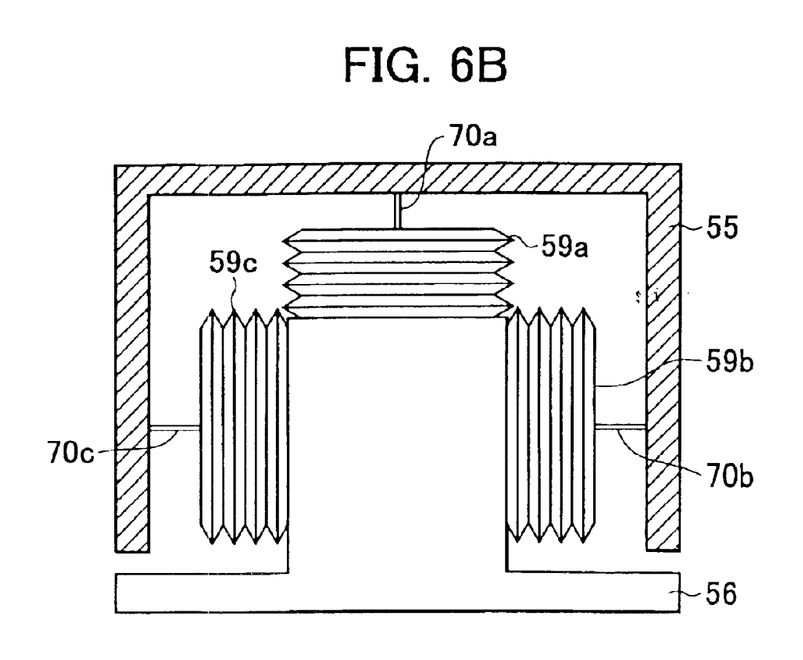
FIG. 6B shows a sixth embodiment of the present invention.

The sixth embodiment, shown in FIG. 6B, differs from the fifth embodiment in that, in this embodiment, thin rods 70a, 70b, and 70c are used instead of the gimbal pistons, and in that this embodiment features an active or a passive damper structure, which is not considered to be a hybrid. The other structural features are the same as those of the fifth embodiment.

Seventh Embodiment

Figure 7A:
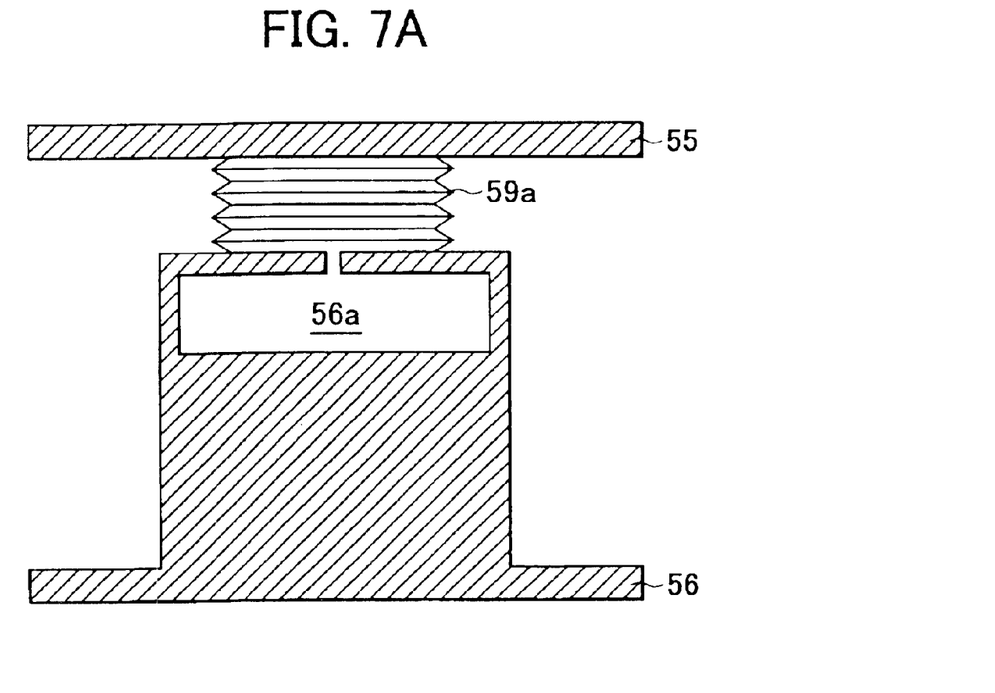
FIG. 7A shows a seventh embodiment of the present invention.

The seventh embodiment, shown in FIG. 7A, differs from the fourth embodiment in that, in this embodiment, an air spring is provided only in the z-axis direction, and in that this embodiment features an active or a passive damper structure, which is not considered to be a hybrid. The other structural features are the same as those of the fourth embodiment.

Eighth Embodiment

Figure 7B:
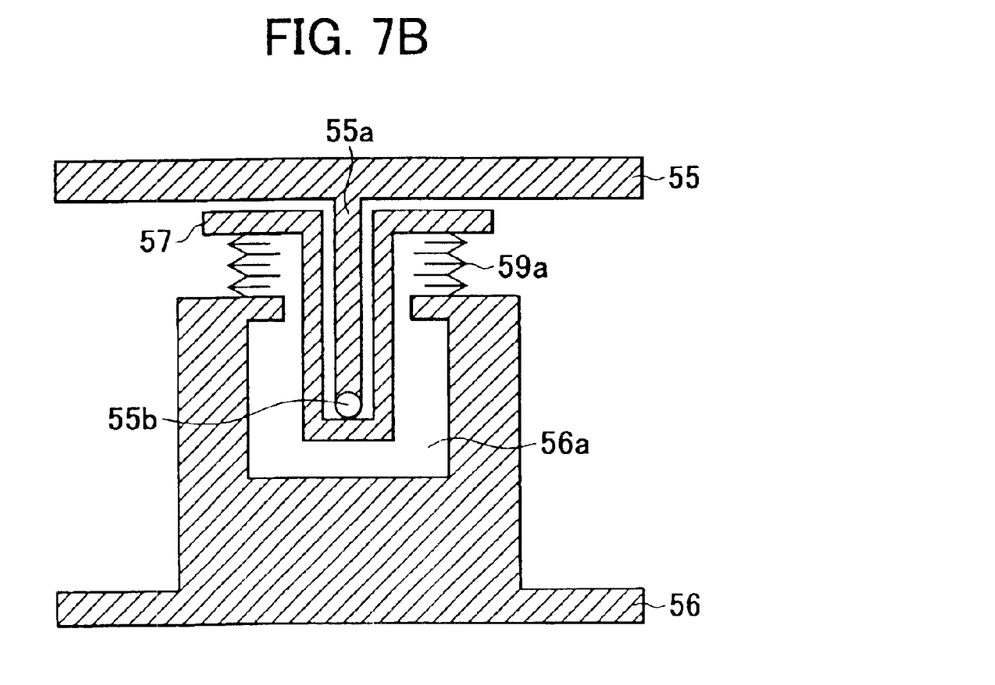
FIG. 7B shows an eighth embodiment of the present invention.

The eighth embodiment, shown in FIG. 7B, differs from the seventh embodiment in that, in this embodiment, a gimbal piston 57 is added, and in that this embodiment features an active or a passive damper structure, which is not considered to be a hybrid. The other structural features are the same as those of the fourth embodiment.

Ninth Embodiment

Figure 8A:
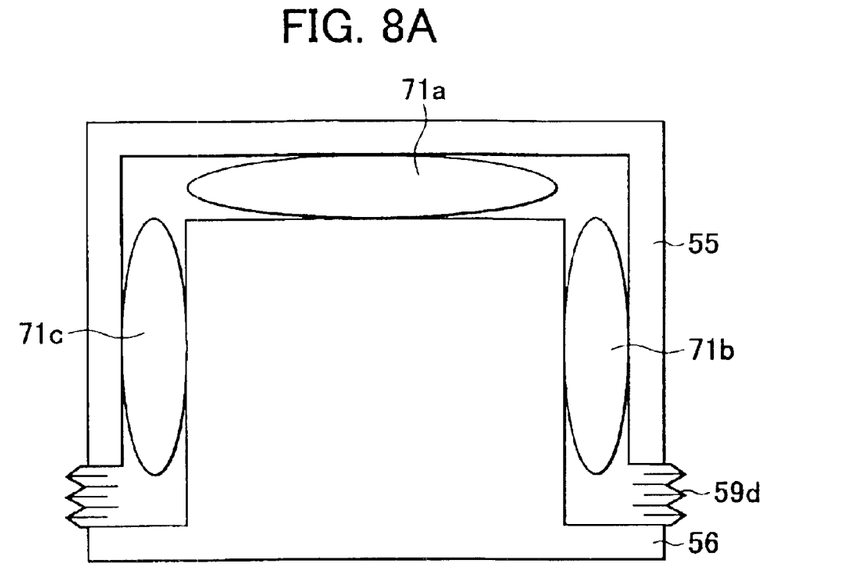
FIG. 8A shows a ninth embodiment of the present invention.

In the ninth embodiment, shown in FIG. 8A, instead of using metallic bellows for forming air springs 71a, 71b, and 71c, a movable cover 55 and a supporting block 56 are connected with metallic bellows 59d to form a hermetically sealed space, so that these elements can be used in a vacuum atmosphere. The air springs 71a, 71b, and 71c may be formed of elastic materials such as rubber. The ninth embodiment, therefore, features an active or a passive damper structure, which is not considered to be a hybrid. The other structural features are the same as those of the fourth embodiment.

Tenth Embodiment

Figure 8B:
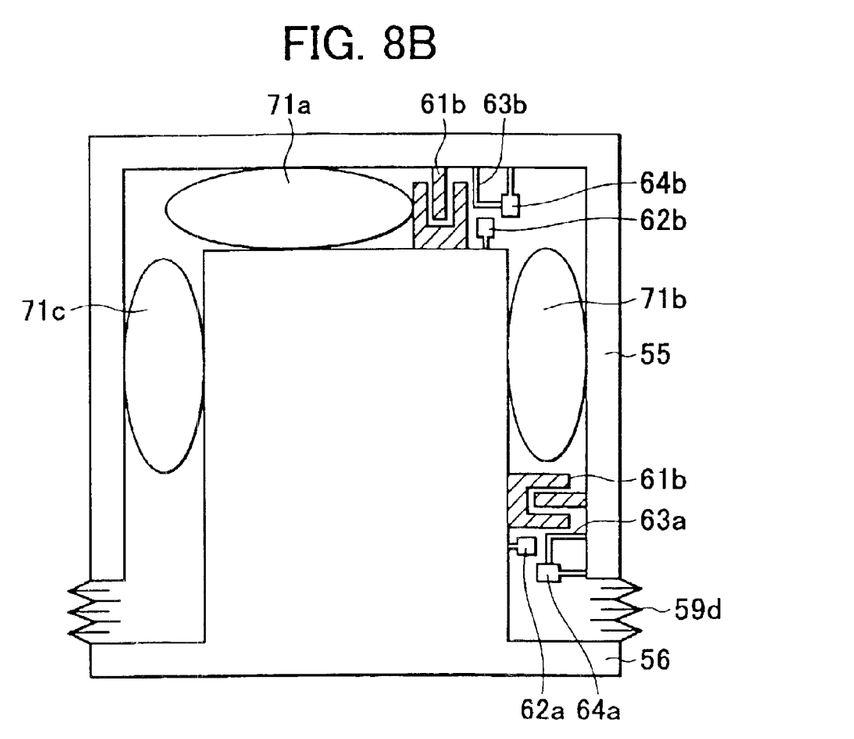
FIG. 8B shows a tenth embodiment of the present invention.

The tenth embodiment, shown in FIG. 8B, differs from the eighth embodiment in that actuators 61a and 61b, position sensors 62a and 62b, detection targets 63a and 63b, and vibration sensors 64a and 64b are added. The tenth embodiment features an active hybrid damper structure using air springs and actuators and makes it possible to remove and to restrict vibration effectively. The other structural features are the same as those of the first embodiment.

A description of a process for producing a semiconductor device using the exposure apparatus 100 will now be given.

Figure 10:
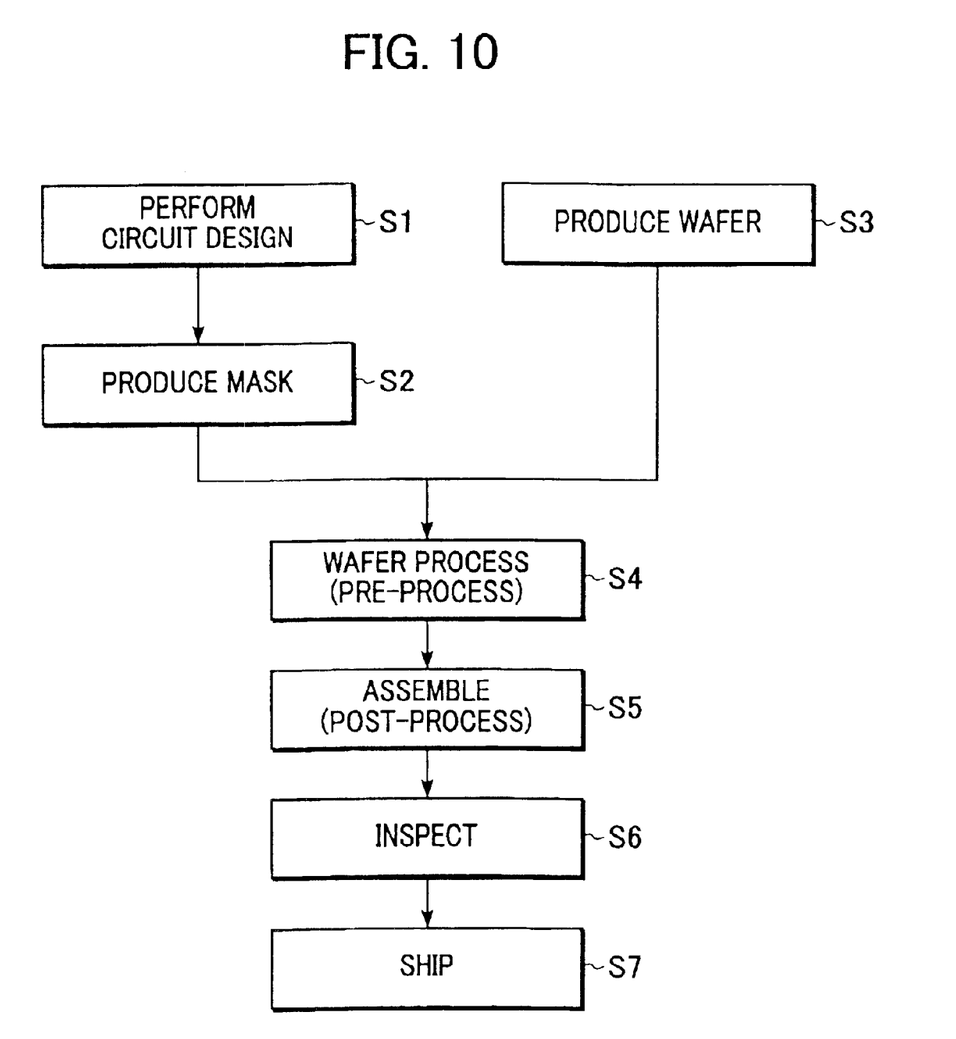
FIG. 10 is a flowchart of the overall production process for producing a semiconductor device.

FIG. 10 is a flowchart showing the overall process for producing the semiconductor device. In Step 1, a circuit is designed for a semiconductor device. In Step 2, a mask is produced based on the designed circuit pattern.

In Step 3, a wafer is produced using, for example, silicon. In Step 4 (called, for example, a wafer process or a pre-processing step), the mask and the wafer are used to form the actual circuit onto the wafer with the exposure apparatus 100 using lithography techniques. Then, in the following step, Step 5 (called, for example, an assembly step or a post-processing step), the wafer with the circuit is formed into a semiconductor chip, wherein assembly (dicing, bonding), packaging (of the chip), and the like, are performed. In Step 6, the semiconductor device produced in Step 5 is inspected by conducting operation confirmation and durability tests. Thereafter, in Step 7, the semiconductor device is shipped.

Step 4, or the wafer process, comprises an oxidation step, a chemical-vapor deposition (CVD) step, an electrode formation step, an ion implantation step, a resist processing step, an exposure step, a development step, an etching step, and a resist removing step. In the oxidation step, the surface of the wafer is oxidized. In the CVD step, an insulation film is deposited on the surface of the wafer. In the electrode formation step, an electrode is formed on the wafer by evaporation. In the ion implantation step, ions are implanted into the wafer. In the resist processing step, a sensitizer is applied to the wafer. In the exposure step, the circuit pattern is transferred onto the wafer with the exposure apparatus 100, after the resist processing step. In the development step, the exposed wafer is developed. In the etching step, portions other than where the developed resist image is formed are etched. In the resist removing step, any unnecessary resist is removed from the wafer after the etching has been performed. By repeating these steps, multiple circuit patterns are formed on the wafer.

Except as otherwise discussed herein, the various components shown in outline or in block form in the Figures are individually well known and their internal construction and operation are not critical either to the making or using or to a description of the best mode of the invention.

While the present invention has been described with reference to what are at present considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus for exposing a substrate to a pattern in a vacuum atmosphere, said apparatus comprising:

a vacuum chamber;

a structure disposed in said vacuum chamber; and a vibration isolating system comprising a metallic bellows and applying a force to said structure in accordance with a pressure of gas in a space defined by said metallic bellows, said metallic bellows being disposed in said vacuum chamber.

2. An exposure apparatus according to claim 1, wherein the space defined by said metallic bellows of said vibration isolating system functions as a gas spring.

3. An exposure apparatus according to claim 2, wherein said vibration isolating system comprises a displacement absorbing mechanism for absorbing displacement of said structure in a direction parallel to a plane perpendicular to expansion and contraction directions of the gas spring.

4. An exposure apparatus according to claim 3, wherein said displacement absorbing mechanism comprises a gimbal piston.

5. An exposure apparatus according to claim 1, further comprising at least one of a displacement sensor, a vibration sensor, and an actuator, which is disposed in the space defined by said metallic bellows so as to be isolated from an atmosphere in said vacuum chamber.

6. An exposure apparatus according to claim 1, wherein said structure comprises a member to support at least one of a mask stage, a projection optical system and a substrate stage.

7. A method of producing a device, said method comprising steps of: exposing a substrate to a pattern using an exposure apparatus as recited in claim 1, and developing the exposed substrate.

* * * * *

UNITED STATES PATENT AND TRADEMARK OFFICE
CERTIFICATE OF CORRECTION

PATENT NO. : 6,897,939 B2
DATED : May 24, 2005
INVENTOR(S) : Hiromichi Hara

It is certified that error appears in the above-identified patent and that said Letters Patent is hereby corrected as shown below:

<u>Title page,</u>
Item [56], References Cited, FOREIGN PATENT DOCUMENTS,
"JP    6066346    *    8/1994" should read
-- JP    6-66346    *    3/1994 --.

Signed and Sealed this

Eleventh Day of October, 2005

JON W. DUDAS
*Director of the United States Patent and Trademark Office*